United States Patent
Nettelbladt et al.

(10) Patent No.: US 6,215,132 B1
(45) Date of Patent: *Apr. 10, 2001

(54) LIGHT-EMITTING DIODE WITH DIVIDED LIGHT-EMITTING REGION

(75) Inventors: Hans Nettelbladt, Bromma (SE); Michael Widman, Mountain View, CA (US)

(73) Assignee: Mitel Semiconductor AB, Jarfalla (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/875,362

(22) PCT Filed: Oct. 30, 1996

(86) PCT No.: PCT/SE96/01392

§ 371 Date: Oct. 28, 1997

§ 102(e) Date: Oct. 28, 1997

(87) PCT Pub. No.: WO97/16855

PCT Pub. Date: May 9, 1997

(30) Foreign Application Priority Data

Nov. 3, 1995 (SE) .................................................. 9503879

(51) Int. Cl.[7] .................................................. H01L 33/00
(52) U.S. Cl. ................................ 257/93; 257/94; 257/98; 372/50
(58) Field of Search ................................ 257/98, 94, 101, 257/102, 93; 438/45, 28, 29; 372/50

(56) References Cited

U.S. PATENT DOCUMENTS

| 4,115,150 | * | 9/1978 | Dyment | 148/1.5 |
| 4,275,403 | * | 6/1981 | Lebailly | 257/98 |
| 4,956,683 | * | 9/1990 | Quintana | 257/93 |
| 4,979,002 | * | 12/1990 | Pankove | 257/98 |
| 5,075,742 | * | 12/1991 | Gerard | 257/101 |
| 5,151,756 | | 9/1992 | Nettelbladt et al. | 357/17 |
| 5,189,496 | * | 2/1993 | Kuwabara | 257/79 |
| 5,216,263 | * | 6/1993 | Paoli | 257/88 |
| 5,543,638 | | 8/1996 | Nettelbladt et al. | 257/98 |
| 5,804,461 | * | 9/1998 | Beyea et al. | 438/45 |

FOREIGN PATENT DOCUMENTS

2649537 * 1/1991 (FR) ...................................... 257/93

* cited by examiner

Primary Examiner—Jerome Jackson, Jr.
(74) Attorney, Agent, or Firm—Jenkens & Gilchrist, P.C.

(57) ABSTRACT

A device for generating light with the aid of a semiconducting material consisting of two electrically conducting contact layers and at least one layer, arranged therebetween, of semiconducting material which comprises a light-emitting semiconducting layer which is divided into at least two permanently parallel-connected sub-regions, delimited by semiconducting material with a higher energy gap than the light-emitting layer or delimited by ion-implanted semiconducting material, wherein the delimiting material shall prevent the propagation of dislocations between the sub-regions.

4 Claims, 1 Drawing Sheet

LIGHT-EMITTING DIODE WITH DIVIDED LIGHT-EMITTING REGION

TECHNICAL FIELD

The present invention relates to a light emitting diode with a divided light-emitting region to ensure that a degradation of the light emissivity by dislocations cannot propagate over the whole of this region.

BACKGROUND ART

Light emitting diodes are used as light sources in a variety of technical applications, from simple consumer products to telecommunication with optical fibres. In applications of the latter character, the requirements for the reliability of the light source are very high. Although a certain variation of the luminous intensity with time can be tolerated in digital equipment, where it is essentially sufficient to distinguish between positions when the diode lights up and when the diode does not light up, the decision whether the light source is switched on or off is based on whether its luminous intensity lies above or below a threshold value. If, because of ageing processes, the luminous intensity of the diode approaches this threshold value, equipment where the light emitting diode is included is no longer reliable.

Light emitting diodes may be inflicted with an ageing mechanism which manifests itself in the form of a network of dislocations arising in the light-emitting region of the light emitting diode. The dislocations are initiated at some defect, located in the light-emitting region, in the semiconductor material when the defective material is subjected to high irradiance while at the same time being subjected to mechanical stresses. The dislocation network may propagate in the whole of the light-emitting region whereby the luminous efficiency drops to a fraction of its original value.

Increased knowledge of this ageing mechanism is used when designing and choosing operating parameters which reduce the probability of this degradation of the light emissivity occurring. However, the degradation cannot be completely eliminated.

For very vital functions, redundancy can be created by simultaneously using at least two parallel-connected light emitting diodes. However, the space is often too limited to be able to use several diodes, for example when feeding light into optical fibres where typical cross sections are 20–100 micrometers.

SUMMARY OF THE INVENTION

The basic idea of the invention is to divide the light-emitting region into at least two sub-regions through zones of semiconductor material which do not allow dislocations to propagate between the regions. In height, the light-emitting sub-regions are delimited by layers of materials with a higher energy gap than the light-emitting material both above and below the light-emitting layer. Because of the high energy gap in these layers, these are transparent to the generated light and, therefore, dislocations which are generated by absorbed light cannot propagate into these regions. In the lateral direction, the delimitation occurs with ion-implanted material which is generated by ion bombardment. By this treatment,.the resistance to mechanical deformation, and hence also to propagation of dislocations, increases.

The reduction of the light emissivity is, in this way, limited to a sub-region and the light quantity emitted by the whole diode decreases only in proportion to the sub-region's share of the entire light-emitting region. For example, a light emitting diode with four equal light-emitting sub-regions and a probability P of degradation of such a region after a certain burning time, this the luminous intensity drops to 75% of the original value with the probability P, to 50% of the original value with the probability $P^2$, to 25% of the original value with the probability $P^3$, and only after the drop-out of all four sub-regions with the probability $P^4$ does the whole light emitting diode expire. This entails very small probabilities of drop-out of more than one sub-region and hence a very great reliability if the device in which the light emitting diode is used tolerates a reduction of the luminous intensity.

DESCRIPTION OF THE PREFERRED EMBODIMENT

Figure 1:
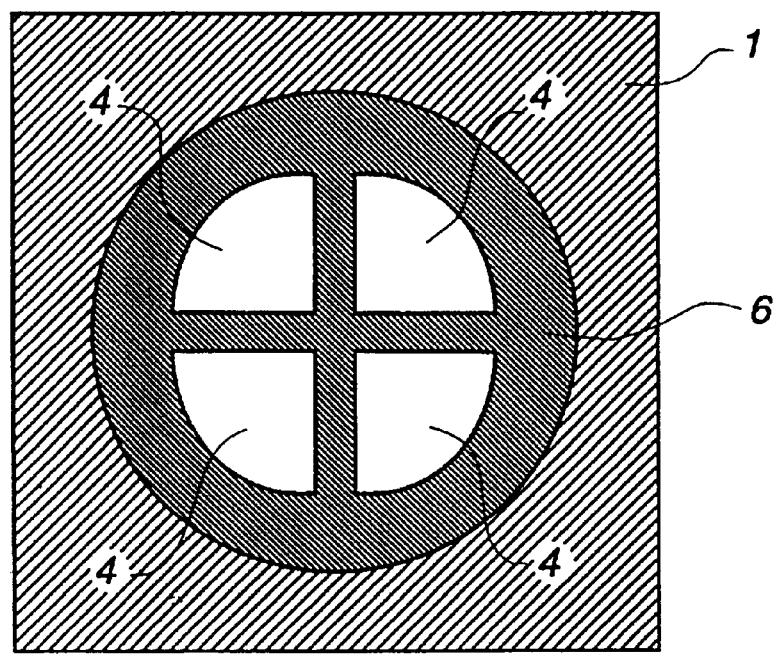
FIG. 1 shows a light emitting diode according to the invention with four light-emitting sub-regions viewed from above.
Figure 2:
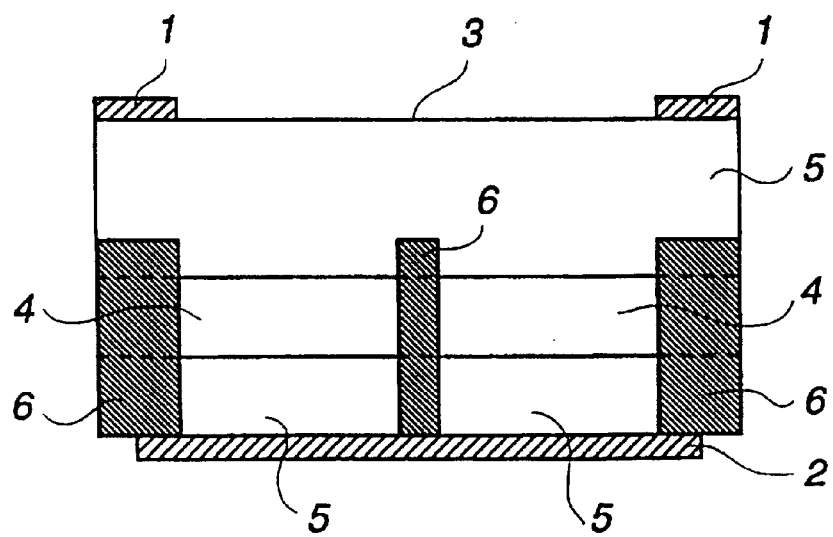
FIG. 2 is a cross section of the same light emitting diode as in FIG. 1.

An embodiment of the invention with a division of the light-emitting region into four sector-shaped sub-regions is shown in FIGS. 1 and 2. A light emitting diode according to the invention in this embodiment comprises an upper conducting contact layer 1, a lower conducting contact layer 2 with a window 3 for releasing light, a light-emitting semiconducting layer 4 surrounded by a lower and an upper layer of semiconducting material 5 with a larger energy gap than the light-emitting material in the layer 4 and proton-implanted barriers 6 which extend in the vertical direction through the lower semiconducting layer, the light-emitting layer and the lower part of the upper semiconducting layer and is designed in the lateral direction in such a way that four sector-shaped light-emitting regions are delimited from each other.

Dislocations arising in any of these sectors cannot propagate through the proton-implanted barriers or the layers with a higher energy gap to the other sectors. Thus, the damage is limited to that sector where the dislocations have started.

What is claimed is:

1. A light emitting semiconductor device, comprising:

at least one light-emitting semiconductor layer arranged between a first electrically conductive contact layer and a second electrically conductive contact layer to form a common light-emitting region; and an ion-implanted barrier region of semiconductor material resistant to the propagation of dislocations extending through said at least one light-emitting semiconductor layer to sub-divide said common light-emitting region into a plurality of isolated sub-regions between said first electrically conductive contact layer and said second electrically conductive contact layer, said first electrically conductive contact layer and said second electrically conductive contact layer being common to said subregions, wherein said barrier region prevents the propagation of dislocations between said subregions of said common light-emitting region.

2. A light emitting semiconductor device as claimed in claim 1, further comprising a layer of semiconductor material extending on each side of said at least one light-emitting semiconductor layer between said at least one light-emitting semiconductor layer and said respective first and second electrically conductive contact layers, said layer of semiconductor material having a higher energy gap than the light-emitting semiconductor layer.

3. A light emitting semiconductor device as claimed in claim 1, wherein said ion-implanted material is proton implanted.

4. A light emitting semiconductor device as claimed in claim 1, wherein said barrier region divides said common light-emitting region into a plurality of sector-shaped subregions.

* * * * *

UNITED STATES PATENT AND TRADEMARK OFFICE
CERTIFICATE OF CORRECTION

PATENT NO.   : 6,215,132 B1
DATED        : April 10, 2001
INVENTOR(S)  : Hans Nettelbladt et al.

It is certified that error appears in the above-identified patent and that said Letters Patent is hereby corrected as shown below:

Column 1,
Line 64, replace "treatment, .the resistance" with -- treatment, the resistance --

Column 2,
Line 8, replace "time, this the luminous" with -- time, means that the luminous --

Signed and Sealed this

Twenty-first Day of May, 2002

Attest:

JAMES E. ROGAN
*Director of the United States Patent and Trademark Office*

*Attesting Officer*